United States Patent
Inoue et al.

(10) Patent No.: US 9,857,676 B2
(45) Date of Patent: Jan. 2, 2018

(54) METHOD AND PROGRAM PRODUCT FOR DESIGNING SOURCE AND MASK FOR LITHOGRAPHY

(71) Applicant: International Business Machines Corporation, Armonk, NY (US)

(72) Inventors: Tadanobu Inoue, Tokyo (JP); David O. Melville, Yorktown Heights, NY (US); Alan E. Rosenbluth, Yorktown Heights, NY (US); Masaharu Sakamoto, Tokyo (JP); Kehan Tian, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 14/892,987

(22) PCT Filed: May 9, 2014

(86) PCT No.: PCT/JP2014/062514
§ 371 (c)(1),
(2) Date: Nov. 20, 2015

(87) PCT Pub. No.: WO2014/192518
PCT Pub. Date: Dec. 4, 2014

(65) Prior Publication Data
US 2016/0103389 A1      Apr. 14, 2016

(30) Foreign Application Priority Data
May 27, 2013   (JP) .................................. 2013-110534

(51) Int. Cl.
*G06F 17/50*   (2006.01)
*G03F 1/36*   (2012.01)
(Continued)

(52) U.S. Cl.
CPC .................. *G03F 1/36* (2013.01); *G03F 1/70* (2013.01); *G06F 17/5072* (2013.01);
(Continued)

(58) Field of Classification Search
CPC .. G03F 7/70441; G03F 7/70433; G03F 7/705; G03F 1/36; G03F 1/144; G06F 17/5068; G06F 17/5072
(Continued)

(56) References Cited

U.S. PATENT DOCUMENTS

| 5,680,588 A | 10/1997 | Gortych et al. |
| 5,815,685 A | 9/1998 | Kamon |

(Continued)

FOREIGN PATENT DOCUMENTS

| JP | 8-297692 A | 11/1996 |
| JP | 8-335552 A | 12/1996 |

(Continued)

OTHER PUBLICATIONS

International Preliminary Report on Patentability dated Dec. 1, 2015.
(Continued)

*Primary Examiner* — Stacy Whitmore
(74) *Attorney, Agent, or Firm* — Scully, Scott, Murphy & Presser, P.C.; David M. Quinn, Esq.

(57) ABSTRACT

A system and method for optimizing (designing) a mask pattern, in which SMO and OPC are collaboratively used to exert a sufficient collaborative effect or are appropriately used in different manners.
The method for designing a source and a mask for lithography includes a step (S1) of selecting a set of patterns; a step of performing source mask optimization (SMO) using the set of patterns, under an optical proximity correction (OPC) restriction rule which is used for selectively restrict-
(Continued)

ing shifting of an edge position of a polygon when OPC is applied to the set of patterns; and a step (S3, S4) of determining a layout of the mask for lithography, by applying OPC to all patterns constituting the mask for lithography using the source optimized through the SMO.

20 Claims, 3 Drawing Sheets

(51) Int. Cl.
*G03F 1/70* (2012.01)
*G03F 7/20* (2006.01)
*G03F 1/00* (2012.01)

(52) U.S. Cl.
CPC .............. *G03F 1/144* (2013.01); *G03F 7/705* (2013.01); *G03F 7/70433* (2013.01); *G03F 7/70441* (2013.01); *G06F 17/5068* (2013.01)

(58) Field of Classification Search
USPC ..................................................... 716/50–56
See application file for complete search history.

(56) References Cited

U.S. PATENT DOCUMENTS

| | | | |
|---|---|---|---|
| 6,453,274 B2 | 9/2002 | Kamon | |
| 6,846,595 B2 | 1/2005 | Smith | |
| 7,147,975 B2 | 12/2006 | Misaka | |
| 7,194,704 B2 | 3/2007 | Kotani et al. | |
| 7,269,817 B2* | 9/2007 | Heng | G03F 1/36 716/132 |
| 7,355,673 B2 | 4/2008 | Hsu et al. | |
| 7,506,299 B2 | 3/2009 | Socha et al. | |
| 7,524,620 B2 | 4/2009 | Misaka | |
| 7,569,312 B2 | 8/2009 | Misaka | |
| 7,594,199 B2 | 9/2009 | Socha et al. | |
| 8,247,141 B2 | 8/2012 | Higaki et al. | |
| 8,438,508 B2 | 5/2013 | Liu | |
| 8,543,947 B2 | 9/2013 | Liu et al. | |
| 8,572,522 B2 | 10/2013 | Iwase et al. | |
| 8,739,082 B2 | 5/2014 | Liu et al. | |
| 9,034,542 B2* | 5/2015 | Fujimura | G03F 1/20 430/296 |
| 9,183,324 B2 | 11/2015 | Liu | |
| 2005/0177810 A1* | 8/2005 | Heng | G03F 1/36 716/54 |
| 2012/0324406 A1* | 12/2012 | DeMaris | G03F 7/70125 716/54 |
| 2013/0036390 A1* | 2/2013 | Torres Robles | G06F 17/5068 716/54 |
| 2013/0074017 A1 | 3/2013 | Iwase et al. | |
| 2013/0139116 A1* | 5/2013 | Chow | G03F 1/36 716/51 |
| 2013/0152025 A1* | 6/2013 | Hurley | G03F 1/70 716/51 |
| 2013/0346037 A1* | 12/2013 | Pierrat | G03F 1/36 703/2 |
| 2014/0068530 A1* | 3/2014 | Chen | G03F 1/144 716/54 |
| 2014/0101622 A1* | 4/2014 | Blatchford | G03F 7/70125 716/52 |
| 2014/0101625 A1* | 4/2014 | Socha | G06F 17/50 716/54 |
| 2015/0227673 A1* | 8/2015 | Lee | G06F 17/5081 716/52 |
| 2015/0332449 A1* | 11/2015 | Hsieh | G03F 7/70441 382/147 |
| 2015/0356234 A1* | 12/2015 | Chen | G03F 1/144 716/52 |
| 2016/0026750 A1* | 1/2016 | Liu | G03F 1/144 716/52 |
| 2016/0109795 A1* | 4/2016 | Inoue | G03F 7/70125 716/53 |
| 2016/0266486 A1* | 9/2016 | Wuister | G03F 7/0002 |
| 2017/0038692 A1* | 2/2017 | Hsu | G03F 1/36 |

FOREIGN PATENT DOCUMENTS

| | | |
|---|---|---|
| JP | 2001-230250 A | 8/2001 |
| JP | 2004-221594 A | 8/2004 |
| JP | 2005-26701 A | 1/2005 |
| JP | 2005-86119 A | 3/2005 |
| JP | 2005-181524 A | 7/2005 |
| JP | 2006-39592 A | 2/2006 |
| JP | 2006-229042 A | 8/2006 |
| JP | 2010-54710 A | 3/2010 |
| JP | 2010-79303 A | 4/2010 |
| JP | 2010-186166 A | 8/2010 |
| JP | 2011-100121 A | 5/2011 |
| JP | 2013-509604 A | 3/2013 |
| JP | 2013-065018 A | 4/2013 |

OTHER PUBLICATIONS

Zhang et al., "Source Mask Optimization Methodology (Smo) and Application to Real Full Chip Optical Proximity Correction", Proc. SPIE 8326, Optical Microlithography XXV, 83261V (Feb. 21, 2012); doi:10.1117/12.916614; http://dx.doi.org/10.1117/12.916614.

* cited by examiner (a)  (b)  (c)

METHOD AND PROGRAM PRODUCT FOR DESIGNING SOURCE AND MASK FOR LITHOGRAPHY

TECHNICAL FIELD

The present invention relates to methods and program products for designing a source and a mask for lithography. More particularly, the present invention relates to a method and a program product for designing a source and a mask for lithography, using source mask optimization (SMO) and optical proximity correction (OPC).

BACKGROUND ART

As the dimension of a circuit pattern formed on a wafer becomes closer to and, further, smaller than the exposure wavelength used in lithography, effects of diffraction and interference of light appear remarkably. Consequently, a desired pattern is no longer transferred by simply forming a light-shielding pattern of the enlarged circuit pattern on a mask. Accordingly, techniques such as optical proximity correction (hereinafter, abbreviated as OPC) in which the shape of the pattern is modified or an assist pattern is added, for example, and a phase-shift mask that locally shifts the phase of the transmitted light by 180 degrees are widely used.

In addition to the techniques such as modifying the shape of the pattern, a technique called source mask optimization (hereinafter, abbreviated as SMO) is also carried out as an improving attempt for a source for lithography. In SMO, in order to form a required circuit pattern on a wafer, the optimum solution of the illumination condition of an exposure apparatus, the shape of a pixelated source, the mask design pattern, or the like is obtained through simulation using a high-speed high-capacity computer while taking into consideration characteristics of the exposure apparatus and an exposure process.

Patent Literature 1 and Non-patent Literature 1 disclose methods for optimizing a mask for lithography, using OPC and SMO. According to the methods, SMO is first performed on selected patterns in order to obtain an optimized source. Then, OPC with the source optimized through SMO is used to design the shape of a mask in accordance with a full-chip design.

However, in existing methods including the methods disclosed in Patent Literature 1 and Non-patent Literature 1, SMO and OPC are performed independently of each other, and consequently the source and the mask are optimized independently of each other. For this reason, a final mask pattern is not necessarily optimized by synergistically using advantages of SMO and OPC. Specifically, the shape of the source optimized through SMO is sometimes not optimum for OPC. That is, optimization according to the existing methods is sometimes not optimization of a source and a mask in which SMO and OPC are collaboratively used to exert a sufficient collaborative effect or are appropriately used in different manners. In particular, optimization is not performed in which whether to collaboratively use SMO and OPC is selectively decided for a so-called hotspot, which is a region including dense/complicated patterns, and for a non-hotspot.

CITATION LIST

Patent Literature

[Patent Literature 1] Japanese Patent Application Publication No. 2011-100121

Non-Patent Literature

[Non-patent Literature 1] "Source Mask Optimization Methodology (SMO) & Application to Real Full Chip Optical Proximity Correction", Proceeding of SPIE Vol. 8326 83261V-11

SUMMARY OF INVENTION

Technical Problem

Accordingly, the present invention aims to provide a method for optimizing (designing) a source and a mask pattern, in which SMO and OPC are collaboratively used to exert a sufficient collaborative effect or are appropriately used in different manners, which is not carried out in the existing methods for optimizing a source and a mask for lithography using OPC and SMO.

Solution to Problem

The present invention provides a method for designing a source and a mask for lithography. The method includes a step of selecting a set of patterns; a step of performing SMO using the set of patterns, under an OPC restriction rule which is used for selectively restricting shifting of an edge position of a polygon when OPC is applied to the set of patterns; and a step of determining a layout of the mask for lithography, by applying OPC to all patterns constituting the mask for lithography using the source optimized through the SMO.

According to the present invention, by performing SMO under the OPC restriction rule for selectively restricting shifting of the edge position, a source may be optimized through SMO while improving the efficiency of SMO computation in which a correction effect obtained by OPC is reflected.

According to an embodiment of the present invention, the step of performing SMO includes a step of performing, without applying the OPC restriction rule, SMO on at least one pattern selected from the set of patterns, and a step of performing, under the OPC restriction rule, SMO on the rest of the set of patterns.

According to the embodiment of the present invention, by performing SMO selectively under the OPC restriction rule, the efficiency of the SMO computation in which the correction effect obtained by OPC is reflected may be further improved.

According to an embodiment of the present invention, the step of performing SMO without applying the OPC restriction rule is performed for patterns for which an SMO computation result is not obtained within a pre-determined period.

According to the embodiment of the present invention, the overflow of the SMO calculation in which the correction effect obtained by OPC is reflected or redo of the computation may be avoided.

According to an embodiment of the present invention, the OPC restriction rule includes fixing at least one edge selected from among edges of a polygon for the set of patterns and fixing an edge of a sub-resolution assist feature (SRAF). The at least one edge includes an edge that is defined during OPC to be performed after the SMO is performed or an edge shorter than a pre-determined length.

DESCRIPTION OF EMBODIMENT

Figure 1:
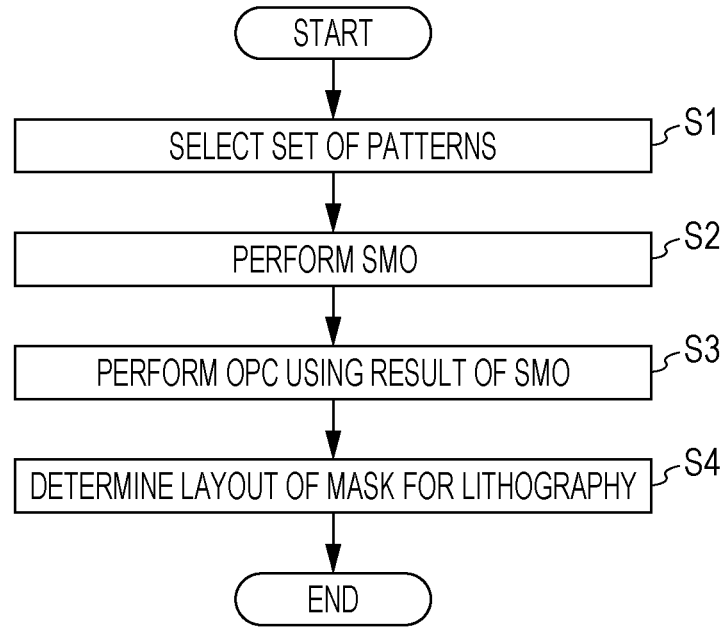
FIG. 1 is a diagram illustrating a flow of a method according to the present invention for designing a source and a mask for lithography.

Referring to the drawings, an embodiment of the present invention will be described. FIG. 1 is a diagram illustrating a flow of a method according to the present invention for designing a source and a mask for lithography. The flow illustrated in FIG. 1 is carried out as a result of a computer executing a program (software) implementing the method. In step S1, a set of patterns are selected. Applying SMO to the entire chip, that is, the entire mask layout, from the beginning is unrealistic because it involves a vast amount of computation. Thus, a set of patterns necessary for performing SMO needs to be selected first. The set of patterns are selected so as to include highly dense pattern portions for which tolerance of pattern displacement within a chip is small (critical). For example, so-called hotspots, such as patterns for forming a static random access memory (SRAM), are selected.

Figure 2:
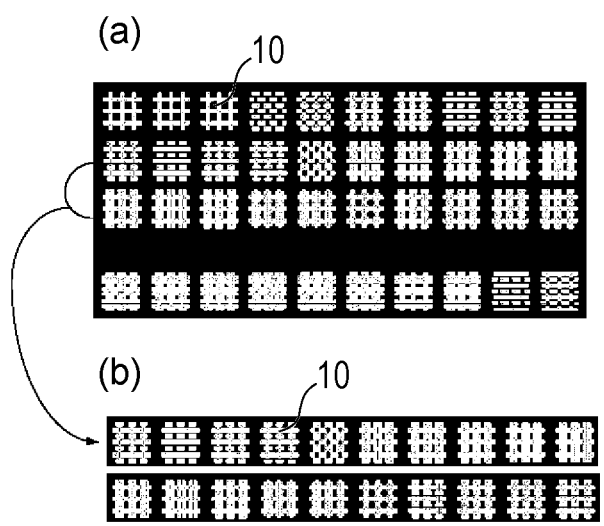
FIGS. 2(a) and 2(b) are diagrams illustrating an example of a set of patterns (clips) used for SMO according to an embodiment of the present invention.

FIGS. 2(a) and 2(b) are conceptual diagrams illustrating selection of a set of patterns. To be precise, the set of patterns are selected as clips 10 illustrated in FIGS. 2(a) and 2(b). Note that, in FIGS. 2(a) and 2(b), each of white pattern regions in a corresponding black frame represents a clip. In general, a clip represents a small portion (that is, a circuit, cell, or pattern) of design for which pre-determined verification is needed. As illustrated in FIG. 2(a), a necessary number of clips of necessary types are selected from a library including a set of clips. FIG. 2(b) illustrates an example in which 20 clips 10 are selected, but, for example, approximately 100 to 1000 clips are selected as needed.

Referring back to FIG. 1, in step S2, SMO is performed using the set of patterns (clips) selected in step S1. SMO according to the present invention has roughly two features. The first one is that SMO computation, that is, nonlinear programming (hereinafter, abbreviated as NLP) for SMO, is performed under an OPC restriction rule, which is used for selectively restricting shifting of an edge position of a polygon when OPC is applied. The second one is that how to perform SMO is changed including how to perform SMO under the OPC restriction rule and whether to selectively apply the OPC restriction rule to the set of patterns (clips). The following mainly describes these two features.

(A) How to Perform SMO Under OPC Restriction Rule

Figure 3:
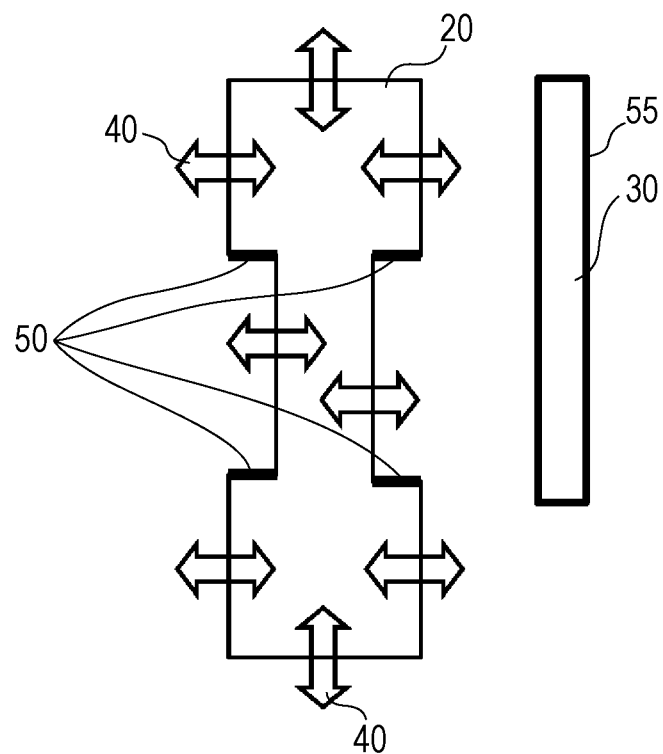
FIG. 3 is a diagram for explaining a restriction on shifting an edge position of a polygon according to the embodiment of the present invention.

FIG. 3 is a diagram for illustrating a restriction on shifting an edge position of a polygon according to the embodiment of the present invention. Referring to FIG. 3, a polygon 20 corresponds to a pattern (clip) and is used in OPC, and a sub-resolution assist feature (hereinafter, abbreviated as SRAF) 30 is to be placed during OPC. Note that the restriction on shifting an edge position of a polygon may be used herein to indicate a broad meaning including a restriction on shifting an edge position of not only the polygon 20 but also the SRAF 30, which is a rectangle in general as illustrated in FIG. 3.

SMO according to the related art permits all edges of the polygon 20 to be freely shifted during NLP computation as indicated by arrows 40 in FIG. 3. SMO according to the present invention restricts this shifting operation of the edges of the polygon 20 of the related art. Specifically, for example, shifting of certain edges, such as edges 50 of the polygon 20 illustrated in FIG. 3, is restricted so as to fix the edges 50. The certain edges used herein refer to edges that are defined to be fixed in step S3 of FIG. 1. Alternatively, edges shorter than a pre-determined length (for example, 10 nm) may be set as the edges to be fixed. Furthermore, for example, edges 55 that define the shape of the SRAF 30 may be fixed so as to make the shape (line width) of the SRAF 30 invariable.

SMO is performed by solving NLP under the OPC restriction rule described above. NLP is solved by deriving the minimum value (min f(x)) of an objective function f(x) under pre-determined restrictions, which has been hitherto performed. The objective function f(x) includes a process window and a process variability band (hereinafter, abbreviated as a PV band) that are related to parameters (performances), such as lithography manufacturability check (hereinafter, abbreviated as LMC). Alternatively, computation of the edge placement error (hereinafter, abbreviated as EPE) which is performed during OPC in step S3 may be used as the objective function f(x) during SMO in step S2.

Here, a variable x is a value representing the pixel value of the source and the shape of the mask. In the case where the shape of the mask is represented in the frequency domain, the variable x represents the amplitude of each frequency component obtained by performing Fourier transform on the shape of the mask. In the case where the shape of the mask is represented in the spatial domain, the variable x represents the position of each edge of the polygon. The pre-determined restrictions include lithography-related restrictions (settings), e.g., a mask error enhancement factor (hereinafter, abbreviated as MEEF) and contrast.

(B) How to Perform SMO by Selectively Applying OPC Restriction Rule

In the case where SMO is performed by solving NLP under the OPC restriction rule described in section (A), the restriction on edge shifting, that is, the small degree of freedom of the variable x, may make it difficult to derive the minimum value of the objective function f(x) (or to cause the objective function f(x) to converge) through NLP within a pre-determined period depending patterns (clips). In such a case, SMO is performed for a pattern (clip) for which a solution is not derived, without applying the OPC restriction rule but using the frequency-domain mask shape obtained by performing Fourier transform on the spatial-domain mask shape, for which the variable x represents the edge position of the polygon. That is, some of patterns (clips) are treated as spatial-domain mask shapes, and the OPC restriction rule is applied thereto. The rest of the patterns (clips) are treated as the frequency-domain mask shapes, and the OPC restriction rule is not applied thereto. In this way, SMO is performed to simultaneously optimize the coexisting spatial-domain mask shapes and frequency-domain mask shapes.

Alternatively, in another configuration, SMO may be performed by using the above-described frequency-domain mask shapes obtained through Fourier transform for predetermined patterns (clips), e.g., patterns (clips) corresponding to hotspots, instead of applying the OPC restriction rule thereto, and by applying the above-described OPC restriction rule to the rest of the patterns (clips). In this case, wavefront engineering (hereinafter, abbreviated as WE) may be applied to some of the patterns (clips) corresponding to hotspots after SMO is performed thereon.

Here, application of WE means conversion of a mask shape represented in the frequency domain into a mask shape represented in the spatial domain. The OPC restriction rule is not applied to patterns (clips) which are converted into mask shapes represented in the spatial domain through WE and patterns (clips) to which WE is not applied and which are continuously treated as mask shapes represented in the frequency domain. The OPC restriction rule is applied to the rest of patterns (clips) of mask shapes represented in the spatial domain. In this way, SMO may be simultaneously performed for the three kinds of patterns (clips) so as to achieve further optimization. With this configuration, a source may be obtained while taking OPC into consideration and final mask shapes optimized without applying the OPC restriction rule may also be obtained for patterns (clips) corresponding to hotspots.

As described above, the present invention enables SMO suitable for each pattern (clip) by selectively applying the OPC restriction rule and appropriately changing the processing content, while avoiding the overflow of SMO processing. Among data items of mask shapes obtained through SMO in step S2 of FIG. 1, data items of mask shapes obtained by applying the OPC restriction rule are discarded, and mask shapes obtained through OPC in step S3 are used. Data items of mask shapes obtained by applying WE without applying the OPC restriction rule during SMO in step S2 are used in place of data items of mask shapes obtained through OPC during OPC in step S3.

Referring back to FIG. 1, in step S3, OPC is performed on the entire mask layout of a chip using the SMO result obtained in step S2. Specifically, OPC is performed on each pattern of the mask layout using the optimum source obtained in step S2 so as to obtain a data item of the optimum mask pattern. At this time, data items of mask shapes obtained by applying WE without applying the OPC restriction rule are used in place of data items of mask shapes obtained through OPC.

In next step S4, layout of a mask for lithography (reticle) is determined/created using the data items of the mask pattern obtained as the OPC result in step S3.

First Example

Figure 4:
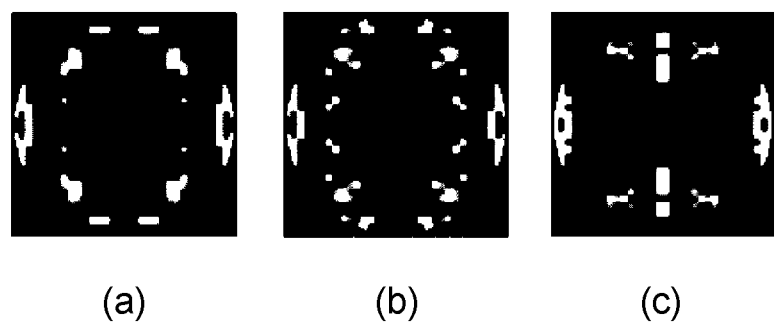
FIGS. 4(a) to 4(c) are diagrams illustrating examples of source images obtained through SMO according to the embodiment of the present invention.
Figure 5:
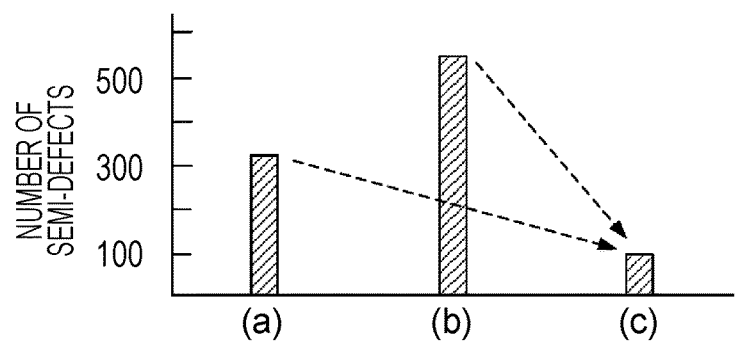
FIGS. 5(a) to 5(c) are diagrams for illustrating a benefit obtained by using the method according to the present invention for designing a source and a mask for lithography.
Figure 6:
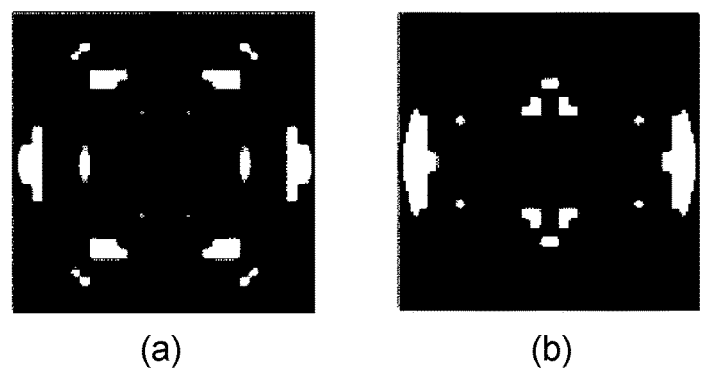
FIGS. 6(a) and 6(b) are diagrams illustrating examples of source images obtained through SMO according to the embodiment of the present invention.
Figure 7:
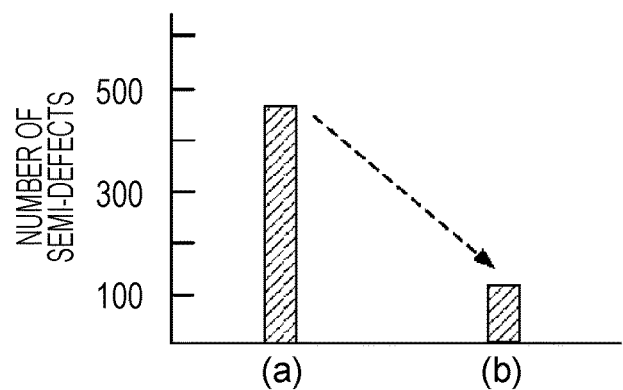
FIGS. 7(a) and 7(b) are diagrams illustrating a benefit obtained by using the method according to the present invention for designing a source and a mask for lithography.

Referring to FIGS. 4(a) to 7(b), examples of the present invention will be described. Referring first to FIGS. 4(a) and 5(c), an example of (A) how to perform SMO under OPC restriction rule described above will be described.

From 100 clips, 9 clips were selected. Then, the following three types of SMO (a) to (c) were performed.

(a) Conventional SMO using frequency-domain mask shapes for which the frequency serves as the variable (b) Conventional SMO using spatial-domain mask shapes for which the edge position of a polygon serves as the variable (c) SMO according to the above-described embodiment of the present invention, which uses spatial-domain mask shapes for which the edge position of a polygon serves as the variable and in which the OPC restriction rule is applied FIGS. 4(a) to 4(c) are diagrams of source images obtained through the above-described types of SMO (a) to (c), respectively. In the figures, a bright (white) part denotes a light-emitting area (pixel). Then, OPC was performed on all the 100 clips using the sources illustrated in FIGS. 4(a) to 4(c), and the number of semi-defects was counted in pattern layout obtained as a result of OPC. Here, a semi-detect is not a perfect defect, such as connected (short-circuited) patterns (bridge) or a partially lost pattern (pinch), but refer to a state in which PV bands that are highly likely to result in a perfect defect are located close to each other within a pre-determined space.

FIGS. 5(a) to (c) each illustrate the number of semi-defects for a corresponding one of the above-described types of SMO (a) to (c). In the case where SMO is performed under the OPC restriction rule according to the present invention, the number of semi-defects illustrated in FIG. 5(c) is reduced by a large amount, compared with the numbers of semi-defects obtained in the case of (a) conventional SMO using frequency-domain mask shapes and (b) conventional SMO using spatial-domain mask shapes.

Second Example

Referring next to FIGS. 6(a) to 7(b), an example of (B) how to perform SMO by selectively applying the OPC restriction rule described above will be described. From 100 clips, which are different from the 100 clips used in the first example, 8 clips were selected. Then, the following two types of SMO (a) and (b) were performed.

(a) Conventional SMO using, for all the 8 clips, frequency-domain mask shapes for which the frequency serves as the variable (b) SMO according to the present invention in which the OPC restriction rule is selectively applied and which uses, for 3 clips among the 8 clips, frequency-domain mask shapes for which the frequency serves as the variable, and uses, for the remaining 5 clips, spatial-domain mask shapes for which the edge position of a polygon serves as the variable.

FIGS. 6(a) and 6(b) are diagrams of source images obtained through the above-described types of SMO (a) and (b), respectively. In the figures, a bright (white) part denotes a light-emitting area (pixel). Then, OPC was performed on all the 100 clips using the sources illustrated in FIGS. 6(a) and 6(b), and the number of semi-defects was counted in pattern layout obtained as a result of OPC.

FIGS. 7(a) and (b) each illustrate the number of semi-defects for a corresponding one of the above-described types of SMO (a) and (b). In the case of the selective SMO according to the present invention, the number of semi-defects illustrated in FIG. 7(b) is reduced by a large amount, compared with the number of semi-defects obtained in the case of (a) conventional SMO using frequency-domain mask shapes.

The embodiment of the present invention has been described with reference to the drawings. However, the present invention is not limited to the embodiment. Without departing from the scope of the present invention, the present invention may be implemented as an embodiment obtained by making a variety of improvements, corrections, and modifications to the embodiment on the basis of knowledge that persons skilled in the art have.

REFERENCE SIGNS LIST

10: pattern/clip
20: polygon
30: SRAF
50, 55: fixed edge

The invention claimed is:

1. A method for designing a source and generating a mask for lithography, said method comprising:
   selecting, using a hardware processor, a set of patterns corresponding to a mask used in a lithographic production of a circuit structure in a semiconductor wafer;
   using said hardware processor to perform a source mask optimization (SMO) process using the set of patterns, under an optical proximity correction (OPC) restriction rule, said hardware processor applying said OPC restriction rule to selectively restrict a shifting of an edge position of a polygon of a mask pattern when applying an OPC to the set of patterns;
   determining, using said hardware processor, a layout of the mask for lithography, by applying OPC to all patterns constituting the mask for lithography using the source optimized through the SMO process; and
   generating a lithographic mask structure on a semiconductor wafer according to said determined mask layout.

2. The method according to claim 1, further comprising:
   performing said SMO process without applying the OPC restriction rule, on at least one pattern selected from the set of patterns, and
   performing, using said hardware processor, under the OPC restriction rule, said SMO on the rest of the set of patterns.

3. The method according to claim 2, wherein the performing said SMO process without applying the OPC restriction rule further comprises: using said hardware processor to perform said SMO process for a pattern for which an SMO computation result is not obtained within a pre-determined period.

4. The method according to claim 2, wherein the performing said SMO process without applying the OPC restriction rule further comprises: using the hardware process to perform said SMO process using a frequency-domain mask shape obtained by performing Fourier transform on a spatial-domain mask shape for which the edge position of the polygon serves as a variable.

5. The method according to claim 2, wherein the at least one pattern includes a pattern corresponding to a hotspot.

6. The method according to claim 1, wherein the OPC restriction rule includes fixing at least one edge selected from among edges of a polygon for the set of patterns and fixing an edge of a sub-resolution assist feature (SRAF).

7. The method according to claim 6, wherein the at least one edge includes an edge that is defined during OPC to be performed after the SMO is performed.

8. The method according to claim 6, wherein the at least one edge includes an edge shorter than a pre-determined length.

9. The method according to claim 1, further comprising:
   applying, using a photolithographic exposure apparatus, an illumination condition optimized according to said SMO process, to the generated lithographic mask to form the circuit structure in said semiconductor wafer.

10. The method according to claim 9, wherein the illumination condition, optimized according to said SMO process, includes a shape of a pixelated illumination source.

11. A computer program product for generating a mask structure used in photolithographic process, said computer program product comprising:
    a non-transitory computer readable medium storing instructions that, when executed by at least one hardware processor, configure the at least one hardware processor to perform a method of:
    selecting a set of patterns corresponding to a mask used in a lithographic production of a circuit structure in a semiconductor wafer;
    performing a source mask optimization (SMO) process using the set of patterns, under an optical proximity correction (OPC) restriction rule, and applying said OPC restriction rule to selectively restrict a shifting of an edge position of a polygon of a mask pattern when applying an OPC to the set of patterns;
    determining a layout of the mask for lithography, by applying OPC to all patterns constituting the mask for lithography using the source optimized through the SMO process; and
    generating a lithographic mask structure on a semiconductor wafer according to said determined mask layout.

12. The computer program product according to claim 11, wherein said method further comprises:
    performing said SMO without applying the OPC restriction rule, on at least one pattern selected from the set of patterns, and
    performing, under the OPC restriction rule, said SMO on the rest of the set of patterns.

13. The computer program product according to claim 12, wherein the performing said SMO process without applying the OPC restriction rule is performed for a pattern for which an SMO computation result is not obtained within a pre-determined period.

14. The computer program product according to claim 12, wherein the performing said SMO process without applying the OPC restriction rule is performed using a frequency-domain mask shape obtained by performing Fourier transform on a spatial-domain mask shape for which the edge position of the polygon serves as a variable.

15. The computer program product according to claim 12, wherein the at least one pattern includes a pattern corresponding to a hotspot.

16. The computer program product according to claim 11, wherein the OPC restriction rule includes fixing at least one edge selected from among edges of a polygon for the set of patterns and fixing an edge of a sub-resolution assist feature (SRAF).

17. The computer program product according to claim 16, wherein the at least one edge includes an edge that is defined during OPC to be performed after the SMO is performed.

18. The computer program product according to claim 16, wherein the at least one edge includes an edge shorter than a pre-determined length.

19. The computer program product according to claim 11, wherein the method further comprises:
    applying, using a photolithographic exposure apparatus, an illumination condition optimized according to said SMO process, to the generated lithographic mask to form the circuit structure in said semiconductor wafer.

20. The computer program product according to claim 19, wherein the illumination condition, optimized according to said SMO process, includes a shape of a pixelated illumination source.

* * * * *